(12) United States Patent
Wang

(10) Patent No.: US 7,714,675 B2
(45) Date of Patent: May 11, 2010

(54) ALL DIGITAL CLASS-D MODULATOR AND ITS SATURATION PROTECTION TECHNIQUES

(75) Inventor: Minsheng Wang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 292 days.

(21) Appl. No.: 11/566,995

(22) Filed: Dec. 5, 2006

(65) Prior Publication Data

US 2008/0129376 A1   Jun. 5, 2008

(51) Int. Cl.
*H03K 7/08* (2006.01)
*H03M 3/00* (2006.01)

(52) U.S. Cl. .................... 332/109; 330/10; 341/143

(58) Field of Classification Search ............. 332/109, 332/110, 106; 375/238; 327/172; 341/143, 341/155, 141, 142, 43; 330/10
See application file for complete search history.

(56) References Cited

U.S. PATENT DOCUMENTS

| | | | |
|---|---|---|---|
| 4,692,737 A * | 9/1987 | Stikvoort et al. ............. 341/50 |
| 4,724,396 A | 2/1988 | Taylor et al. | |
| 5,617,058 A | 4/1997 | Adrian et al. | |
| 6,031,481 A | 2/2000 | Craven | |
| 6,107,876 A | 8/2000 | O'Brien | |
| 6,373,334 B1 | 4/2002 | Melanson | |
| 6,606,044 B2 | 8/2003 | Roeckner et al. | |
| 6,924,757 B2 * | 8/2005 | Adams et al. ............... 341/143 |
| 6,956,513 B1 * | 10/2005 | Wang ......................... 341/143 |
| 6,970,503 B1 | 11/2005 | Kalb | |
| 7,038,535 B2 * | 5/2006 | Lee ............................. 330/10 |
| 7,046,080 B2 | 5/2006 | Watts | |
| 7,315,268 B1 * | 1/2008 | Hong ......................... 341/142 |

| | | | |
|---|---|---|---|
| 2003/0031245 A1 | 2/2003 | O'Brien | |
| 2004/0165661 A1 | 8/2004 | Braun | |
| 2004/0184621 A1 | 9/2004 | Andersen et al. | |
| 2004/0189377 A1 * | 9/2004 | Lee ............................. 330/10 |
| 2005/0012649 A1 | 1/2005 | Adams et al. | |
| 2005/0040980 A1 * | 2/2005 | Miller ......................... 341/152 |
| 2005/0083114 A1 | 4/2005 | Risbo | |

(Continued)

OTHER PUBLICATIONS

S. R. Norsworthy, R. Schier, and G.C. Ternes, "Delta-Sigma Data Converters: Theory, Design, and Simulations," IEEE Press, Chapter 10, pp. 309-315, New York, 1997.

(Continued)

*Primary Examiner*—Robert Pascal
*Assistant Examiner*—Ryan J Johnson
(74) *Attorney, Agent, or Firm*—McAndrews Held & Malloy, Ltd.

(57) ABSTRACT

Methods and systems for modulating an input electrical signal are disclosed and may comprise modulating input signals utilizing a digital Class-D modulator and generating a digital output signal that is proportional to the input signals. The digital Class-D modulator may be comprised of four stages. To avoid integrator saturation, the output of at least one integrator stage may be limited by utilizing limiters in integrator feedback loops. The digital Class-D modulator utilizes a pulse width modulation technique. For increased signal to noise ratio (SNR) at a desired output power, the magnitude of a triangular waveform oscillator voltage may be greater than the magnitude of an integrated input signal. The digital output signal may be fed back to an input of at least one of the four stages in the digital Class-D modulator. The triangular waveform oscillator frequency may be adjusted to match desired output frequency.

18 Claims, 6 Drawing Sheets

U.S. PATENT DOCUMENTS

2006/0008095 A1    1/2006   Tsuji
2006/0044057 A1    3/2006   Hezar et al.
2006/0232351 A1*  10/2006  Nielsen ..................... 332/109

OTHER PUBLICATIONS

B. P. Brandit, "Oversampled Analog-To-Digital Conversion," Ph. D. dissertation, Stanford University, pp. 16-18, Oct. 1991.

Richard Schreier, "The Delta-Sigma Toolbox Version 7.1," pp. 1-24, Dec. 11, 2004.

European Search Report corresponding to European Patent Application No. 07014444.9-2215, dated Dec. 8. 2009.

Antunes et al., "Digital Multilevel Audio Power Amplifier with a MASH Sigma-Delta Modulator to Reduce Harmonic Distortion." IEEE, vol. 2, Jun. 20, 2005, pp. 525-528, XP010850134.

Magrath et al., "Design and implementation of a FPGA sigma-delta power DAC." IEEE, Nov. 2007, pp. 511-521, XP010249811.

* cited by examiner

ALL DIGITAL CLASS-D MODULATOR AND ITS SATURATION PROTECTION TECHNIQUES

CROSS-REFERENCE TO RELATED APPLICATIONS/INCORPORATION BY REFERENCE

[Not Applicable]

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to electrical signal modulation. More specifically, certain embodiments of the invention relate to a method and system for an all-digital class-D modulator and its saturation protection techniques.

BACKGROUND OF THE INVENTION

Mobile phone technology is continually being improved to increase efficiency and reduce handset size, weight, and battery requirements. Reduced power consumption leads to smaller, lighter handsets with longer talk times. Increased efficiency is necessary for increased battery lifetime, as well as to support the ever-increasing features designed into mobile phones. Features such as MP3 players, FM radio, video players, and even televisions are being integrated into portable handsets. A common aspect of all these features is audio, thus requiring high quality audio amplification with minimal power usage. In addition to the RF amplifier circuit, one of the main power usage components in mobile phone handsets is the audio amplifier circuitry.

The audio output requirements of a mobile phone handset include a powerful polyphonic ring tone, natural and clear voice reproduction, and clean, noise-free music reproduction, either through headphones or earphones, or over the hand set built-in speaker. Thus, the system may be capable of delivering high output power for built-in speaker operation, lower power but high quality audio output for voice or music playback, and low power consumption when idle. Even when no input signal is present, such as in a lull in conversation, there is still significant power usage by the audio circuits. One technique to reduce power usage is to shut down audio amplifiers when no input signal is present. Another is to improve the efficiency of the amplifier.

Primary factors in audio amplifier performance include frequency response, gain, noise, and distortion. While it is highly advantageous to increase battery lifetime, it must be accomplished without sacrificing audio signal output quality, i.e. maintaining high gain while suppressing noise and distortion.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for an all-digital Class-D modulator and its saturation protection techniques, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for modulating an input electrical signal. Aspects of the method may comprise modulating input signals utilizing a digital Class-D modulator and generating a digital output signal that is proportional to the analog input signals. The digital Class-D modulator may comprise four stages. To avoid integrator saturation, the output of at least one integrator stage may be limited by utilizing limiters in integrator feedback loops. The digital Class-D modulator utilizes a pulse width modulation technique. For increased signal to noise ratio (SNR) at a desired output power, the magnitude of a triangular waveform oscillator voltage may be greater than the magnitude of an integrated input signal. The digital output signal may be fed back to an input of at least one of the four stages in the digital Class-D modulator. The triangular waveform oscillator frequency may be adjusted to match desired output frequency. The gain stages in the digital Class-D modulator may be programmed to tune the signal transfer function (STF) and noise transfer function (NTF).

Figure 1:
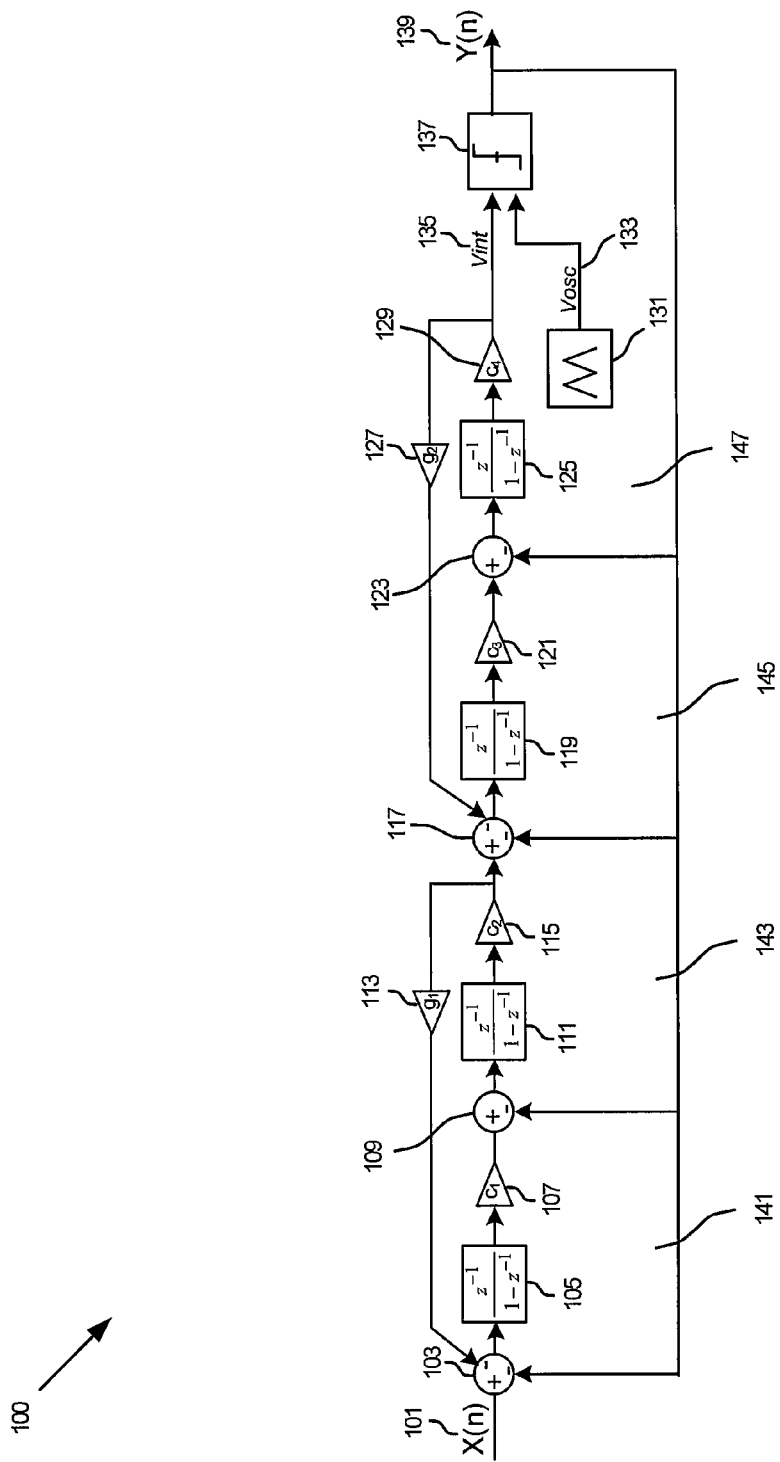
FIG. 1 is a block diagram of an exemplary digital Class-D digital modulator in accordance with an embodiment of the invention.

FIG. 1 is a block diagram of an exemplary digital Class-D digital modulator in accordance with an embodiment of the invention. Referring to FIG. 1, the exemplary digital Class-D modulator may comprise four stages 141, 143, 145, and 147 with adders 103, 109, 117, and 123, integrators 105, 111, 119, and 125, integrator gain stages 107, 115, 121, and 129, and resonator gain feedback loops 113 and 127. In addition to the four stages, the exemplary digital Class-D modulator may comprise a triangle waveform generator 131 and a comparator 137.

The input signal X(n) 101 may be applied at the positive input to the adder 103. The output signal Y(n) 139 feedback loop and the resonator gain feedback loop 113 may be communicated to the negative inputs of adder 103. The output of adder 103 may be coupled to the input of the integrator 105 which may then be coupled to the integrator gain stage 107. The output of integrator gain stage 107 may be coupled to the positive input of adder 109 along with the output signal 139 communicated to the negative input of adder 109. The output of the adder 109 may be communicated to the integrator 111, the output of which may then be communicated to the integrator gain stage 115. The output of the integrator gain stage 115 may be coupled to a negative terminal of adder 103 through the resonator feedback loop 113 and also to the positive input of adder 117.

In addition, the resonator feedback loop 127 and the output signal Y(n) 139 may be communicated to the negative inputs of the adder 117. The output of the adder 117 may be coupled to the integrator 119, the output of which may then be coupled to the integrator gain stage 121. The output of the integrator gain stage may be coupled to the positive input to adder 123. In addition, output signal Y(n) may be communicated to the negative input of adder 123. The output of the adder 123 may be coupled to the integrator 125, the output of which may be coupled to the integrator gain stage 129. The output of the integrator gain stage 129, Vint 135, may be communicated to an input terminal of the comparator 137. This signal may also be fed back to a negative input of the adder 117 through the resonator feedback loop 127. The output of the triangular waveform generator 131 may be coupled to another input of the comparator 137. The output Y(n) 139 of the exemplary digital Class-D modulator may be defined as the output of comparator 137, which may also be fed back to a negative input of the adder 103 as well as to adders 109,117, and 123.

In operation, an input signal X(n) 101 may be applied to the exemplary digital Class-D modulator at the positive input to adder 103. The output signal Y(n) 139 and the signal from feedback loop 113 may be subtracted from the input signal X(n) 101 and may then be integrated and amplified by integrator 105 and integrator gain stage 107, respectively. The output signal of the integrator gain stage 107 may be communicated to the positive input to adder 109. The output signal Y(n) 139 may be subtracted from the integrated output from output gain stage 107 at the adder 109, and then integrated and amplified by the integrator 111 and the integrator gain stage 115. The output signal from the integrator gain stage 115 may be fed back through resonator feedback loop 113 to a negative input to adder 103, and also communicated to a positive input of the adder 117. The output signal Y(n) 139 and the signal from the resonator feedback loop 127 may be subtracted from the positive input to adder 117. The output signal from the adder 117 may be communicated to the integrator and integrator gain blocks 119 and 121, and the output of integrator gain block 121 may be communicated to the positive input of adder 123. The output signal Y(n) 139 may be subtracted from the signal at the positive input to adder 123, and the result may be applied to the integrator and integrator gain blocks 125 and 129. The output signal of integrator gain block 129 may be communicated to one input of the comparator 137, and also may be fed back to a negative input of adder 117 through resonator feedback loop 127. The output of the triangular waveform generator 131 may also be communicated to an input of the comparator 137. In instances when the input signal Vint 135 may be lower in magnitude than the input signal $V_{osc}$ 133, the output of the comparator 137 may be low, and when the input signal $V_{int}$ 135 may be higher than the input signal $V_{osc}$ 133, the output of comparator 137 may be high. This may lead to pulse width modulation, where the width of the pulse may be proportional to the magnitude of the input signal Vint 135.

The signal transfer function (STF) may be defined as the output signal Y(n) 139 divided by the input signal X(n) 101. Applying this relation to the above described circuit may result in the following equation:

$$\frac{X}{Y} = \frac{c_4 c_3 c_2 c_1 z^{-4}}{[(1-z^{-1})^2 + c_2 c_1 g_1 z^{-2}]} \atop {[(1-z^{-1})^2 + c_4 z^{-1}(1-z^{-1}) + (1+g_2)c_4 c_3 z^{-2}] + \atop c_4 c_3 c_2 (1-z^{-1})z^{-3} + c_4 c_3 c_2 c_1 z^{-4}}$$

Similarly, the noise transfer function (NTF) may be determined from the output signal Y(n) divided by a quantization noise of the circuit:

$$\frac{Y}{N} = \frac{(1-z^{-1})^2 [c_2 c_1 g_1 z^{-2} + (1-z^{-1})^2]}{[(1-z^{-1})^2 + c_2 c_1 g_1 z^{-2}]} \atop {[(1-z^{-1})^2 + c_4 z^{-1}(1-z^{-1}) + (1+g_2)c_4 c_3 z^{-2}] + \atop c_4 c_3 c_2 (1-z^{-1})z^{-3} + c_4 c_3 c_2 c_1 z^{-4}}$$

The STF and NTF may be utilized to determine the frequency response of the exemplary digital Class-D digital modulator. This may be accomplished by inserting values for integrator gain and resonator feedback loop gain into the above equations.

Figure 2:
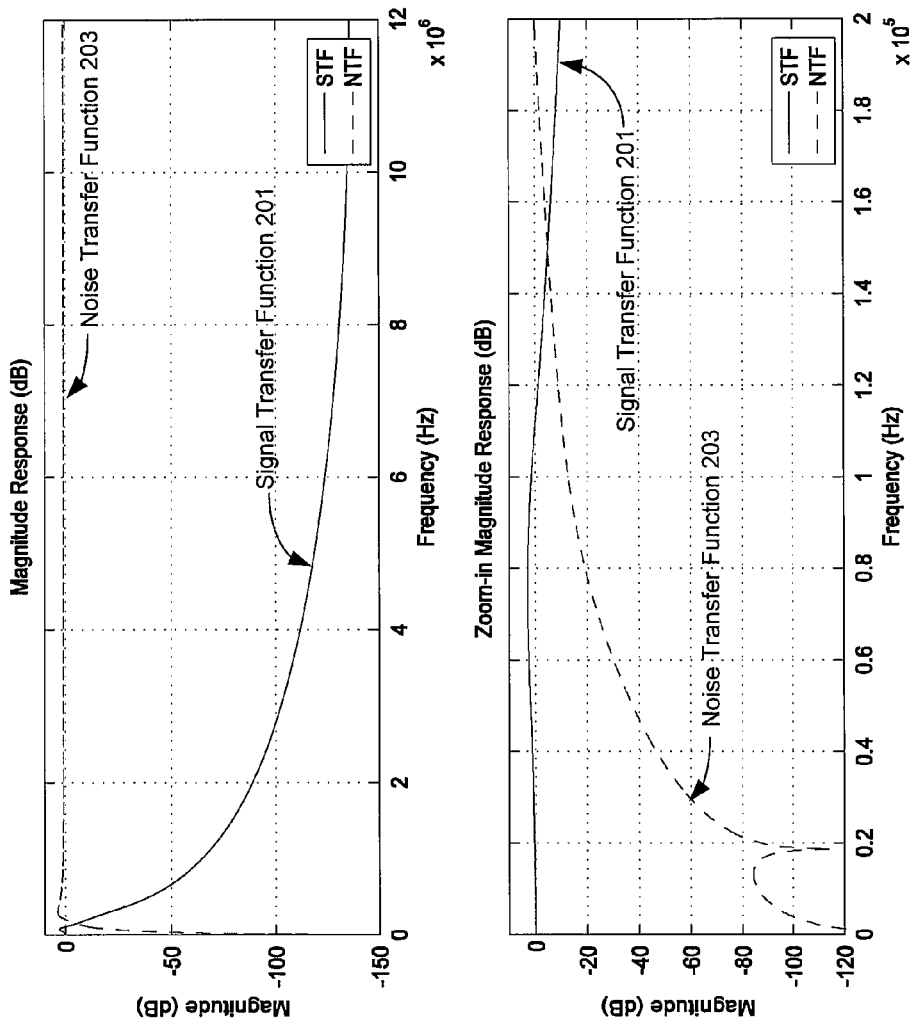
FIG. 2 is a diagram illustrating an exemplary digital Class-D digital modulator signal transfer function (STF) and noise transfer function (NTF) frequency response in accordance with an embodiment of the invention.

FIG. 2 is a diagram illustrating an exemplary digital Class-D digital modulator signal transfer function (STF) and noise transfer function (NTF) frequency response in accordance with an embodiment of the invention. Referring to FIG. 2, the exemplary digital Class-D digital modulator STF 201 and NTF 203 are shown with variables determined as described below. The x-axis comprises frequency and the y-axis comprises the STF 201 and NTF 203 magnitude in dB. The upper plot shows the STF 201 and NTF 203 over a frequency range of 0-12 MHz, whereas the lower plot shows the same STF 201 and NTF 203 but over a smaller frequency range (0-200 kHz). The frequency range from 0-20 kHz is of interest in audio applications, for example.

For stability of an exemplary digital Class-D modulator 100, the slew rate (SR), or switching speed, of the integrator output $V_{int}$ 135 may be less than the slew rate of the triangle waveform $V_{OSC}$ 133. The SR of a sine wave, $V_{int}=A_i$ sin $(2*\pi*f_u*t+\phi)$, may be $A_i*2*\pi*f_u$, where $A_i$ may be the amplitude of the signal, $f_u$ may be the bandwidth of the STF, and $\pi=3.14159$. The SR of a triangular waveform may be $2*A_{tri}*f_{osc}$, where $A_{tri}$ may be the magnitude of the triangular wave signal and $f_{osc}$ is the frequency of the triangular waveform generator 131. Thus, the relation may follow as:

$$A_i*2*\pi*f_u < 2*A_{tri}*f_{osc}.$$

In instances where the input signals $V_{int}$ 135 and $V_{OSC}$ 133 may be the same full scale amplitude of 1, this relation may simplify to:

$$f_u < f_{osc}/\pi$$

Thus, for stability, the bandwidth $f_u$ of the STF may be smaller than $f_{osc}/\pi$.

Referring back to FIG. 2, there is shown exemplary STF and NTF curves utilizing exemplary values for the integrator gain coefficients, $c_1$ to $c_4$, and the resonator gain coefficients, $g_1$ and $g_2$. In the lower plot of FIG. 2, which shows the STF 201 and NTF 203 over a frequency range from 0-200 kHz, but concentrating on the range from 0-20 kHz, the STF remains relatively flat, around zero dB, throughout the range, but the NTF remains more than 80 dB lower.

Figure 3:
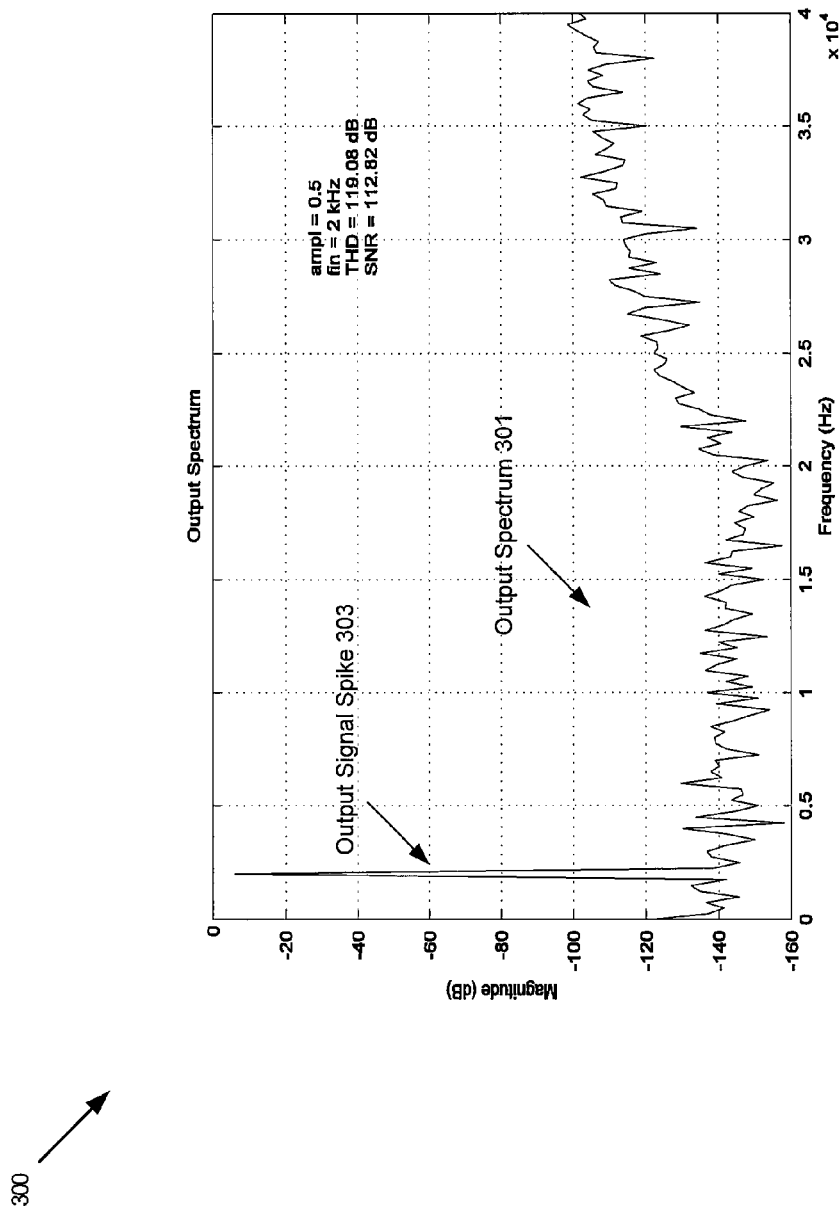
FIG. 3 is a diagram illustrating an exemplary digital Class-D digital modulator output spectrum with input amplitude of 0.5 in accordance with an embodiment of the invention.

FIG. 3 is a diagram illustrating an exemplary digital Class-D digital modulator output spectrum 301 with input amplitude of 0.5 in accordance with an embodiment of the invention. Referring to FIG. 3, the y-axis comprises the simulated output spectrum 301 magnitude in dB and the x-axis comprises frequency in Hz. The simulated spectrum shows a minimum near 20 kHz, in agreement with the results shown in FIG. 2. The frequency of the input signal in the simulation may be 2 kHz, which may coincide with the spike 303 in the magnitude near 2 kHz. The resulting signal to noise ratio (SNR) may be 113 dB, demonstrating the ability of the digital Class-D modulator to generate an output signal with high SNR.

Figure 4:
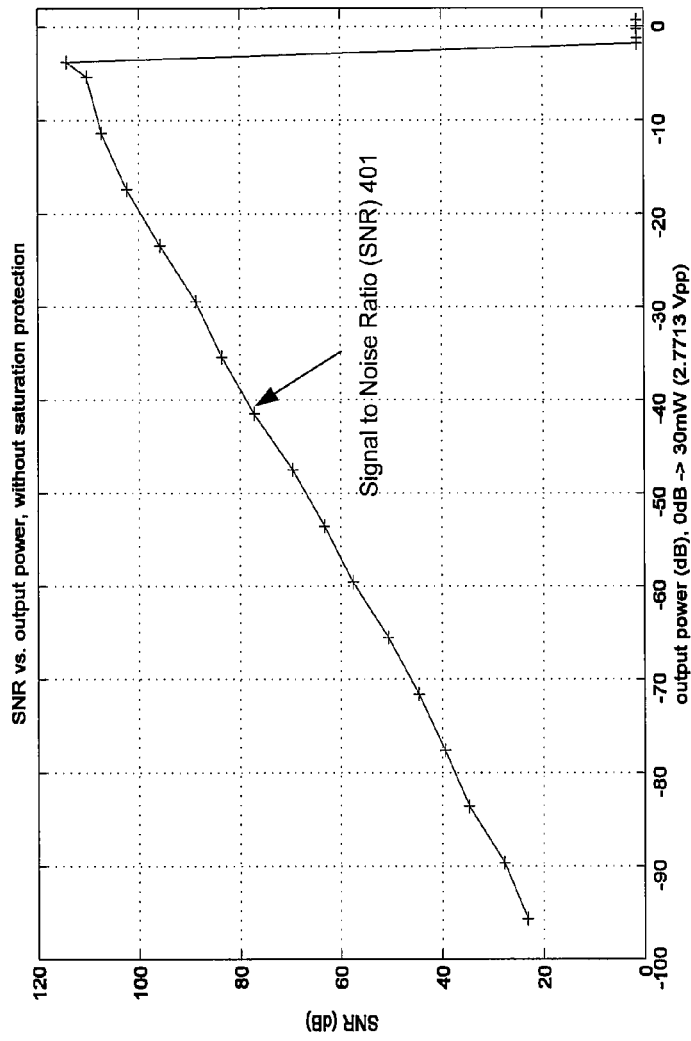
FIG. 4 is a diagram illustrating an exemplary modulator signal to noise ratio (SNR) versus output power in accordance with an embodiment of the invention.

FIG. 4 is a diagram illustrating an exemplary modulator signal to noise ratio (SNR) versus output power in accordance with an embodiment of the invention. Referring to FIG. 4, the y-axis comprises SNR 401 in dB and the x-axis comprises output power in dB, where 0 dB may coincide with 30 mW power. The plot demonstrates an increase of SNR 401 with output power to a peak of greater than 110 dB, and a sudden drop in SNR 401 above approximately −4 dB in output power. The reduction in SNR 401 at higher output power may be a result of integrator saturation, which may be addressed utilizing the design shown in FIG. 5.

Figure 5:
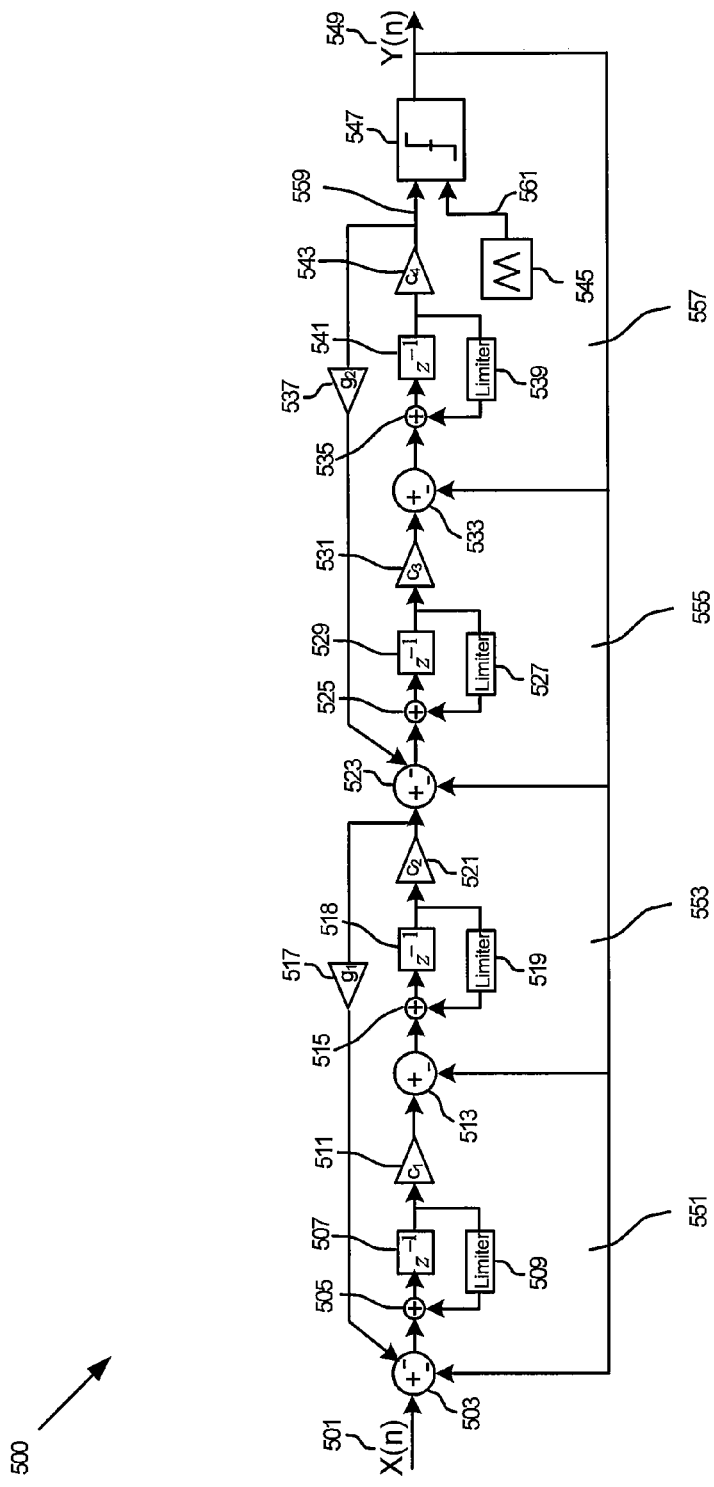
FIG. 5 is a block diagram of an exemplary digital Class-D digital modulator with feedback limiters in accordance with an embodiment of the invention.

FIG. 5 is a block diagram of an exemplary digital Class-D digital modulator with feedback limiters in accordance with an embodiment of the invention. Referring to FIG. 5, the exemplary digital Class-D modulator with integrator limiters may comprise four stages 551, 553, 555, and 557 with adders 503, 505, 513, 515, 523, 525, 533, and 535, integrators 507, 518, 529, and 541, integrator gain stages 511, 521, 531, and 543, integrator limiters 509, 519, 527, and 539, resonator feedback loops 517 and 537, triangular waveform generator 545, and comparator 547.

The input signal X(n) 501 may be communicated to the positive input of adder 503. The output signal Y(n) 549 and the signal from resonator feedback loop 517 may be subtracted from the input signal X(n) by adder 503. This signal may then be coupled to the adder 505 where the output of the limiter 509 may also be coupled. The output of the adder 505 may be coupled to the integrator 507, the output of which may be fed back to the adder 505 through the limiter 509 and also to the integrator gain stage 511. The output of integrator gain stage 511 may be coupled to the positive input of adder 513. The output signal Y(n) 549 may be communicated to the negative input of the adder 513. The output of the adder 513 may be coupled to an input of the adder 515. The output of the limiter 519 may also be coupled to an input of the adder 515. The output of the adder 515 may be coupled to the integrator 518. The output of the integrator 518 may be coupled to the input of the limiter 519 and to the positive input of the adder 523. The output signal Y(n) 549 and the output of the feedback loop 537 may be communicated to the negative inputs of the adder 523.

The output of the adder 523 may be coupled to the adder 525. The output of the limiter 527 may also be coupled to the adder 525. The output of the adder 525 may be coupled to the integrator 529, the output of which may be coupled to the input of the limiter 527 and to the input of the integrator gain stage 531. The output of the integrator gain stage 531 may be coupled to the positive input of the adder 533. The output signal Y(n) 549 may be communicated to the negative input of the adder 533. The output of the adder 533 may be coupled to an input of the adder 535. The output of the limiter 539 may be coupled to another input of the adder 535, and the output of the adder 535 may be coupled to the integrator 541. The output of the integrator 541 may be coupled to the input of the limiter 539 and to the input of the integrator gain stage 543. The output of the integrator gain stage 543 may be coupled to an input of the comparator 547 and also fed back to a negative input of the adder 523 through the resonator feedback loop 537. The triangle waveform generator 545 may be coupled to another input of the comparator 547. The output of the comparator 547 may be the digital Class-D modulator output and may be defined as the output signal Y(n) 549. The output signal Y(n) 549 may be fed back to negative inputs of adders 503, 513, 523 and 533.

In an embodiment of the invention, the values of integrator gains $c_1$, $c_2$, $c_3$ and $C_4$ of the integrator gain stages 511, 521, 531 and 543 may be programmed to tune the signal transfer function (STF) and noise transfer function (NTF) of the digital Class-D modulator. In addition, the gain $g_1$ and $g_2$ in the resonator feedback loops 517 and 537 may also be programmed to tune the STF and NTF.

In operation, an input signal X(n) 501 may be communicated to a positive input of the adder 503. The output signal of gain stage 517 and the output signal Y(n) 549 may be subtracted from X(n) 501 at the adder 503. The resulting output may be added to the output of the limiter 509 by the adder 505. The output of the adder 505 may be integrated by the integrator 507. The output of the integrator 507 may be fed back to the adder 505 through the limiter 509, which may protect the integrator from saturating by limiting the integrator 507 output values between −2 and 2. The output of the integrator 507 may also be amplified by the integrator gain stage 511 before being communicated to the positive input of the adder 513. The output signal Y(n) 549 may be subtracted from the output of the gain stage 511, and the result may be summed with the output of the limiter 519 before being integrated by the integrator 518. The output of the integrator 518 may be fed back through the limiter 519, which may protect the integrator 518 from saturating by limiting the integrator 518 output values between −2 and 2. The output of the integrator 518 may also be amplified by the integrator gain stage 521. The output of the integrator gain stage 521 may be fed back to a negative input of adder 503 through the resonator gain feedback loop 517 and also to the positive input of the adder 523. The output signal of the resonator feedback loop 537 and the output signal Y(n) 549 may be subtracted from the output integrator gain stage 521 at the adder 523. The output of the adder 523 may be summed with the output of the limiter 527 by the adder 525, and the output signal of the adder 525 may be integrated by the integrator 529.

The output of the integrator 529 may be fed back to the adder 525 through the limiter 527, which may protect the integrator 529 from saturating by limiting the integrator 529 output values between −1 and 1. The output of the integrator 529 may also be amplified by the integrator gain stage 531 before being coupled to the positive input of the adder 533. The output signal Y(n) 549 may be subtracted from the output signal of the integrator gain stage 531 by the adder 533, and then added to the output signal of the limiter 539 at the adder 535 before being integrated by the integrator 541. The output of the integrator 541 may be fed back to the adder 535 by the limiter 539, which may protect the integrator 541 from saturating by limiting the integrator 541 output values between −0.5 and 0.5. The output of the integrator 541 may be amplified by the integrator gain stage 543 and then coupled to an input of the comparator 547. The output of integrator gain stage 543 may also be fed back to a negative input of adder 523 by resonator feedback loop 537. The output of triangle waveform generator 545 may be compared to the output of the integrator gain stage 543 by the comparator 547. In instances where the output signal of the integrator gain stage 543 may be higher than the triangle waveform generator signal, the comparator 547 output may be high, and in instances when the output of the integrator gain stage 543 may be lower than the triangle waveform generator 545 signal, the comparator 547 output may be low. This may lead to pulse width modulation, where the width of the pulse may be proportional to the magnitude of the input signal.

Figure 6:
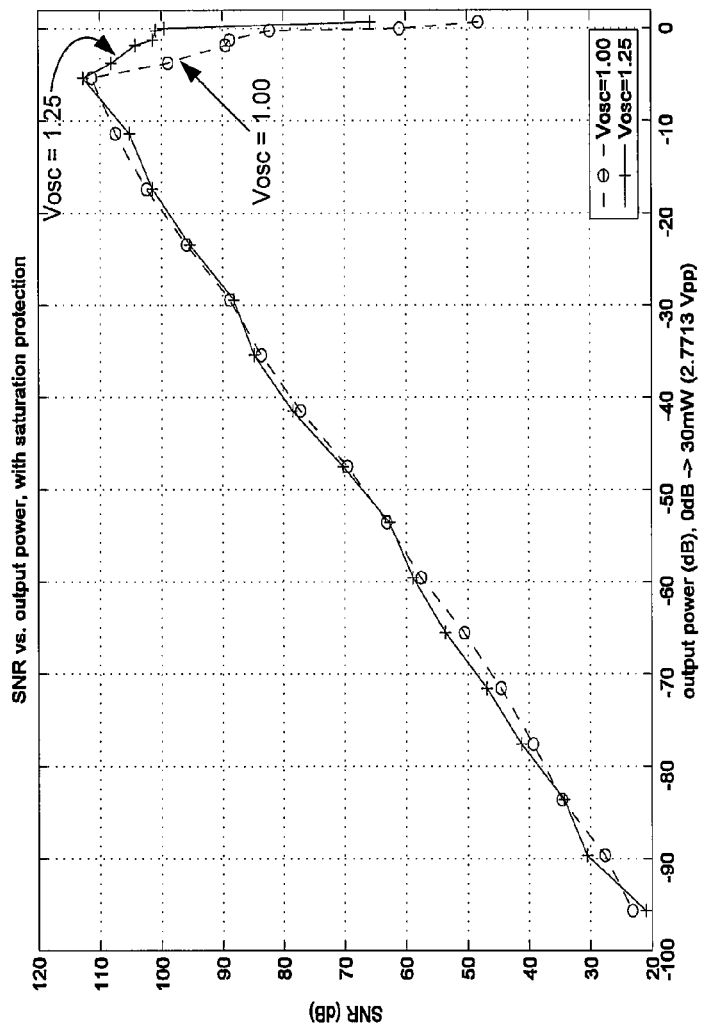
FIG. 6 is a diagram illustrating an exemplary digital Class-D modulator with feedback limiters signal to noise ratio (SNR) versus output power in accordance with an embodiment of the invention.

FIG. 6 is a diagram illustrating an exemplary digital Class-D modulator with feedback limiters signal to noise ratio (SNR) versus output power in accordance with an embodiment of the invention. Referring to FIG. 6, the y-axis comprises the signal to noise ratio (SNR) of an exemplary digital Class-D modulator with saturation protection, as described above for FIG. 5. The x-axis comprises output power of the digital Class-D modulator where 0 dB corresponds to 30 mW output power. The SNR increases with the output power and decreases sharply at higher power, as in FIG. 2, but with saturation protection, the SNR at 0 dB is significantly higher, more than 80 dB with oscillator voltage $V_{OSC}$=1.00 V. The SNR at 0 dB may be increased even further to more than 100 dB by increasing the oscillator voltage $V_{OSC}$ to 1.25 V.

In an embodiment of the invention, a method and system is described for modulating an input electrical 501 signal utilizing a digital Class-D modulator 500 and generating a digital output signal 549 that is proportional to the input signal 301. The digital Class-D modulator 500 may be comprised of four stages 551, 553, 555 and 557. To avoid integrator saturation, the output of at least one integrator stage 507, 518, 529, and 541 may be limited by utilizing limiters 509, 519, 527 and 539 in integrator feedback loops. The digital Class-D modulator 500 utilizes a pulse width modulation technique. For increased signal to noise ratio (SNR) 600 at a desired output power, the magnitude of a triangular waveform oscillator voltage 561 may be greater than the magnitude of an integrated input signal 559. The digital output signal 549 may be fed back to an input of at least one of the four stages 551, 553, 555, and 557 in the digital Class-D modulator 500. The triangular waveform oscillator 545 frequency may be adjusted to match desired output frequency. The values of gain $c_1$, $c_2$, $c_3$ and $c_4$ in the gain stages 511, 521, 531 and 543 in the digital Class-D modulator 500 may be programmed to tune the signal transfer function (STF) 201 and noise transfer function (NTF) 203.

Certain embodiments of the invention may comprise a machine-readable storage having stored thereon, a computer program having at least one code section for communicating information within a network, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for modulating an input electrical signal, the method comprising:
modulating input signals utilizing a digital Class-D modulator with saturation protection provided via a limiter in a feedback loop in each of a plurality of stages of said digital Class-D modulator, wherein each of said plurality of stages comprises a digital integrator, a digital limiter, and a digital gain stage; and
generating by said digital Class-D modulator, a digital output signal that is proportional to said input signals.

2. The method according to claim 1, wherein said digital Class-D modulator comprises a fourth-order digital Class-D modulator.

3. The method according to claim 1, comprising limiting an output of at least one of a plurality of integrators in said digital Class-D modulator utilizing at least one integrator feedback loop in said digital Class-D modulator for said saturation protection.

4. The method according to claim 3, comprising limiting by a limiter within said at least one integrator feedback loop, an output of said at least one of a plurality of integrators.

5. The method according to claim 1, comprising modulating said input signals by said digital Class-D modulator utilizing pulse width modulation.

6. The method according to claim 1, comprising comparing a magnitude of a voltage of a reference signal comprising a triangular waveform oscillator signal with a magnitude of a signal generated from said input signals.

7. The method according to claim 6, comprising adjusting a frequency of said triangular waveform oscillator signal.

8. The method according to claim 1, comprising feeding back said digital output signal of said digital Class-D modulator to an input of at least one of a plurality of stages in said digital Class-D modulator.

9. The method according to claim 1, comprising programming a gain of at least one of a plurality of gain stages in said digital Class-D modulator.

10. A system for modulating an input electrical signal, the system comprising:
   one or more circuits for modulating input signals, said one or more circuits comprising a digital Class-D modulator and a limiter, wherein said one or more circuits are operable to provide saturation protection via said limiter in a feedback loop in each of a plurality of stages of said digital Class-D modulator, wherein each of said plurality of stages comprises a digital integrator, a digital limiter, and a digital gain stage; and
   said one or more circuits are operable to generate a digital output signal that is proportional to said input signals.

11. The system according to claim 10, wherein said digital Class-D modulator comprises a fourth order digital Class-D modulator.

12. The system according to claim 10, wherein said one or more circuits comprise one or more integrator feedback loops that enable said saturation protection for at least one integrator in said digital Class-D modulator.

13. The system according to claim 12, wherein said one or more circuits comprise one or more limiters utilized in said at least one of said plurality of integrator feedback loops.

14. The system according to claim 10, wherein said digital Class-D modulator utilizes pulse width modulation.

15. The system according to claim 10, wherein said one or more circuits are operable to compare a magnitude of a voltage of a reference signal comprising a triangular waveform oscillator signal to a magnitude of a voltage of a signal generated from said input signal.

16. The system according to claim 15, wherein said one or more circuits enables adjustment of a frequency of said triangular waveform oscillator signal.

17. The system according to claim 10, wherein said one or more circuits are operable to feed back said digital output signal to an input of at least one stage of said plurality of said stages of said digital Class-D modulator.

18. The system according to claim 10, wherein said one or more circuits comprise a plurality of integrator gain stages, wherein said one or more circuits enable programming of at least one of said plurality of integrator gain stages.

* * * * *